(12) United States Patent
You et al.

(10) Patent No.: US 12,401,355 B2
(45) Date of Patent: Aug. 26, 2025

(54) NON-CONTACT SWITCH CONTROL SYSTEM

(71) Applicant: DARWIN PRECISIONS CORPORATION, Hsinchu County (TW)

(72) Inventors: Ran-Shiou You, Hsinchu County (TW); Ya Han Ko, Hsinchu County (TW); Chih-Ping Hsu, Hsinchu County (TW); Hsing-Yu Chen, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 41 days.

(21) Appl. No.: 18/137,448

(22) Filed: Apr. 21, 2023

(65) Prior Publication Data

US 2024/0213973 A1 Jun. 27, 2024

(30) Foreign Application Priority Data

Dec. 23, 2022 (TW) .................................. 111149638

(51) Int. Cl.
*H01H 9/16* (2006.01)
*H03K 17/00* (2006.01)
*H03K 17/296* (2006.01)

(52) U.S. Cl.
CPC ........... *H03K 17/002* (2013.01); *H01H 9/167* (2013.01); *H03K 17/296* (2013.01)

(58) Field of Classification Search
CPC .... H03K 17/002; H03K 17/296; H03K 17/94; H03K 17/941; H03K 2217/96003;
(Continued)

(56) References Cited

U.S. PATENT DOCUMENTS

2009/0295713 A1* 12/2009 Piot .......................... G06F 3/038
  345/156
2015/0180471 A1*  6/2015 Buttolo ................. B60R 16/005
  307/116

(Continued)

FOREIGN PATENT DOCUMENTS

JP      2019142686 A  *  8/2019
JP      2022002991 A  *  1/2022
(Continued)

*Primary Examiner* — Elim Ortiz

(57) ABSTRACT

A non-contact switch control system includes: a switch set, configured to receive a sensing signal from a sensed target, the switch set including a first non-contact switch and a second non-contact switch, the sensing signal including a first sensing signal and a second sensing signal; a storage unit, configured to store a control program; and a processing unit, connected to the switch set and the storage unit and configured to execute the control program and control the switch set based on the sensing signal. The control program includes: determining whether the first non-contact switch receives the first sensing signal and obtaining a first determination result; in the situation where the first determination result indicates "Yes", determining whether the second non-contact switch receives the second sensing signal and obtaining a second determination result; and in the situation where the second determination result indicates "Yes", disabling the second non-contact switch.

8 Claims, 7 Drawing Sheets

(58) Field of Classification Search
CPC ........ H01H 9/167; B66B 1/46; B66B 5/0006; B66B 5/0037; B66B 2201/4638
USPC .... 327/365, 407, 408, 99, 108, 94; 200/308, 200/314, 317, 310; 307/98, 99, 112, 137, 307/139, 141.8, 415, 650
See application file for complete search history.

(56) References Cited

U.S. PATENT DOCUMENTS

| | | |
|---|---|---|
| 2022/0098005 A1 | 3/2022 | Lee et al. |
| 2022/0106159 A1 | 4/2022 | Yerazunis et al. |
| 2022/0335745 A1 | 10/2022 | Lai et al. |

FOREIGN PATENT DOCUMENTS

| | | | |
|---|---|---|---|
| TW | 201813307 A | | 4/2018 |
| TW | M610677 U | | 4/2021 |
| TW | M625605 U | | 4/2022 |
| WO | WO-2023195088 A1 | * | 10/2023 |

* cited by examiner

NON-CONTACT SWITCH CONTROL SYSTEM

FIELD OF THE INVENTION

The present disclosure relates to a non-contact switch control system, and more particularly to a non-contact switch control system that prevents non-contact switches from being triggered unintentionally by an object with a large cross-sectional area.

BACKGROUND OF THE INVENTION

Non-contact switches are often used in various control panels. Since non-contact switches may be triggered to operate a system without contact, the transmission chain of germ caused by contacting switches may be avoided.

However, although non-contact switches may reduce the risk of germ transmission, due to the non-contact characteristics thereof, a plurality of non-contact switches may be triggered unintentionally in actual use when the movement of operating a non-contact switch is excessive or when the cross-sectional area of an object is relatively large.

For example, when non-contact switches are applied to an operation panel of an elevator, a plurality of non-contact switches may be triggered unintentionally by items (such as bags, backpacks and furniture) carried by passengers on the elevator. In another example, when a person raises his arm to press a non-contact switch, some non-contact switches of irrelevant floors may be unintentionally triggered. In yet another example, there could be a lot of passengers taking the elevator at the same time, causing the above issues of unintentionally contacting some non-contact switches of irrelevant floors.

SUMMARY OF THE INVENTION

In view of the above, the present disclosure provides a non-contact switch control system. The non-contact switch control system includes: a switch set, a storage unit, and a processing unit. The switch set includes: a first non-contact switch and a second non-contact switch (i.e., the switch set includes a plurality of non-contact switches). The switch set is capable of receiving a sensing signal from a sensed target; the storage unit is configured to store a control program; and the processing unit is configured to execute the control program. When the sensing signal of the sensed target is received within a sensing region of the switch set, the non-contact switch control system may take a non-contact switch that first receives the sensing signal as the first non-contact switch, take a non-contact switch other than the first non-contact switch as the second non-contact switch, determine whether the first non-contact switch receives a first sensing signal (i.e., the first non-contact switch receives the sensing signal from the sensed target), then determine whether the second non-contact switch receives a second sensing signal (i.e., the second non-contact switch receives the sensing signal from the sensed target), and if determination results both indicate Yes, determine that a plurality of non-contact switches in the switch set are triggered unintentionally by an object with a large cross-sectional area within a short time, and disable the second non-contact switch. By means of the above-mentioned functional structure, even if the plurality of non-contact switches are triggered unintentionally by the object with the large cross-sectional area within a short time, only the non-contact switch that first receives the sensing signal from the sensed target, i.e., the first non-contact switch, will be triggered. Therefore, according to the present disclosure, the service efficiency of the non-contact switch control system may be improved, and the possibility that a large quantity of non-contact switches are triggered unintentionally within a short time may be reduced.

A non-contact switch control system according to the present disclosure includes a switch set, a storage unit and a processing unit. The switch set is configured to receive a sensing signal from a sensed target, wherein the switch set includes a first non-contact switch and a second non-contact switch, the sensing signal includes: a first sensing signal and a second sensing signal. The storage unit is configured to store a control program. The processing unit is connected to the switch set and the storage unit and configured to execute the control program and control the switch set based on the sensing signal. The control program includes: determining whether the first non-contact switch receives the first sensing signal and obtaining a first determination result; in the situation where the first determination result indicates "Yes", determining whether the second non-contact switch receives the second sensing signal and obtaining a second determination result; and in the situation where the second determination result indicates "Yes", disabling the second non-contact switch.

According to one embodiment of the present disclosure, in the above-mentioned non-contact switch control system, the control program further includes: after the second non-contact switch is disabled, determining whether the switch set receives the sensing signal and obtaining a third determination result; and in the situation where the third determination result indicates "Yes", disabling the switch set.

According to one embodiment of the present disclosure, in the above-mentioned non-contact switch control system, the control program further includes: in the situation where the second determination result indicates "Yes", triggering the first non-contact switch.

According to one embodiment of the present disclosure, in the above-mentioned non-contact switch control system, the control program further includes: in the situation where the second determination result indicates "Yes", the first non-contact switch is not triggered.

According to one embodiment of the present disclosure, the above-mentioned non-contact switch control system further includes: a timing unit, connected to the processing unit and configured to count a time period. The control program further includes: in the situation where the first determination result indicates "Yes", starting to count the time period, and determining whether the second non-contact switch receives the second sensing signal within the time period.

According to one embodiment of the present disclosure, the above-mentioned non-contact switch control system further includes: a prompt unit, connected to the processing unit and configured to provide an operation prompt.

According to one embodiment of the present disclosure, in the above-mentioned non-contact switch control system, the switch set further includes: an emitting unit, configured to transmit a wireless signal to the sensed target, the sensing signal being a reflection signal of the wireless signal.

To sum up, when the sensing signal of the sensed target is received within sensing regions of a plurality of non-contact switches, the non-contact switch control system may take the non-contact switch that first receives the sensing signal as the first non-contact switch, take the non-contact switch other than the first non-contact switch as the second non-contact switch, determine whether the first non-contact switch receives the first sensing signal, then determine whether the second non-contact switch receives the second sensing signal, and if determination results are both Yes, determine that a plurality of non-contact switches in the switch set are triggered unintentionally by an object with a large cross-sectional area within a short time, and disable the second non-contact switch. By means of the above-mentioned functional structure of the present disclosure, even if the plurality of non-contact switches are triggered unintentionally by the object with the large cross-sectional area within a short time, only the non-contact switch that first receives the sensing signal from the sensed target, namely the first non-contact switch, may be triggered. According to the present disclosure, the service efficiency of the non-contact switch control system may be improved, and the possibility that a large quantity of non-contact switches are triggered unintentionally within a short time may be avoided.

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF PREFERRED EMBODIMENTS

Figure 1:
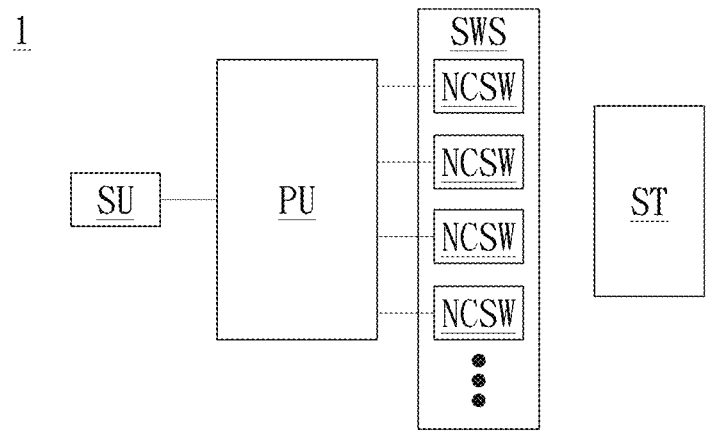
FIG. 1 is a block diagram of a non-contact switch control system according to an embodiment of the present disclosure.
Figure 2:
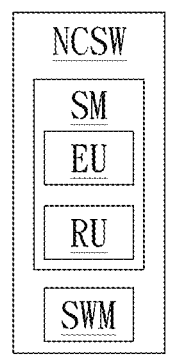
FIG. 2 is a block diagram of a non-contact switch according to an embodiment of the present disclosure.

Reference is made to FIG. 1 and FIG. 2. FIG. 1 is a block diagram of a non-contact switch control system 1 according to an embodiment of the present disclosure, and FIG. 2 is a block diagram of a non-contact switch NCSW according to an embodiment of the present disclosure.

According to this embodiment, the non-contact switch control system 1 of the present disclosure includes: a switch set SWS, a processing unit PU, and a storage unit SU. The switch set SWS includes a plurality of non-contact switches NCSW. The processing unit PU is connected to the plurality of non-contact switches NCSW and the storage unit SU.

According to this embodiment, the switch set SWS includes the plurality of non-contact switches NCSW. Among the plurality of non-contact switches NCSW, a non-contact switch NCSW that first receives a sensing signal (i.e., a first sensing signal, a sensing signal at a first time point) from a sensed target ST is designated as a first non-contact switch NCSW1, and a non-contact switch NCSW that later receives the sensing signal (i.e., a second sensing signal, a sensing signal at a second time point) from the sensed target ST, or a non-contact switch NCSW other than the first non-contact switch NCSW1 is designated as a second non-contact switch NCSW2. That is, the switch set includes the first non-contact switch and the second non-contact switch, and the sensing signal includes the first sensing signal and the second sensing signal. Each non-contact switch NCSW may receive the sensing signal from the sensed target ST within a sensing region of the non-contact switch NCSW through a sensing module SM. Each non-contact switch NCSW includes a switch module SWM. Each switch module SWM has a first switch state and a second switch state. The storage unit SU is configured to store a control program, and the processing unit PU is configured to execute the control program. The control program includes the following steps: determining whether the first non-contact switch NCSW1 receives the first sensing signal and obtain a first determination result; in the situation where the first determination result indicates "Yes", determining whether the second non-contact switch NCSW2 receives the second sensing signal and obtain a second determination result; and in the situation where the second determination result indicates "Yes", disabling the second non-contact switch NCSW2.

In order to avoid unclear definitions of terms, some terms used in the embodiments of the present disclosure are explained below first.

According to the present disclosure, the first non-contact switch NCSW1 refers to a non-contact switch NCSW that first (i.e., at the first time point) receives the sensing signal from the sensed target ST when the flow of the present disclosure is carried out, that is, the first non-contact switch NCSW1 is one non-contact switch NCSW of the plurality of non-contact switches NCSW of the switch set SWS. Each non-contact switch NCSW in the switch set SWS may be designated as the first non-contact switch NCSW1.

According to the present disclosure, the second non-contact switch NCSW2 refers to a non-contact switch NCSW that receives the sensing signal from the sensed target ST after (i.e., at the second time point) the first non-contact switch NCSW1 when the flow of the present disclosure is carried out, that is, the second non-contact switch NCSW2 is selected from the plurality of non-contact switches NCSW of the switch set SWS, and there may be one or more second non-contact switches NCSW2. According to one embodiment, non-contact switches NCSW other than the first non-contact switch NCSW1 in the switch set SWS are all designated as second non-contact switches NCSW2. Each non-contact switch NCSW in the switch set SWS may be designated as the second non-contact switch NCSW2.

According to the present disclosure, the sensing signal includes the first sensing signal and the second sensing signal. The first sensing signal may refer to the sensing signal received by the first non-contact switch NCSW1 and the sensing signal of the sensed target ST received at the first time point. The second sensing signal may refer to the sensing signal received by the second non-contact switch NCSW2 and the sensing signal of the sensed target ST received at the second time point, that is, at a time point later to the first time point. The first time point and the second time point may be used to determine whether there are a plurality of non-contact switches NCSW in the switch set SWS being triggered by the sensed target ST within a short time. According to the present disclosure, whether a plurality of non-contact switches NCSW are triggered unintentionally by the sensed target ST within a short time may be determined by determining whether the first non-contact switch NCSW1 receives the first sensing signal and by determining whether the second non-contact switch NCSW2 receives the second sensing signal.

According to the present disclosure, the term "disabling" may refer to an action that causes a component to lose an original function in the system. For example, disabling the second non-contact switch NCSW2 may refer to an action that causes the processing unit PU to ignore a signal from the second non-contact switch NCSW2, or an action that causes the processing unit PU to transmit a control signal that causes the second non-contact switch NCSW2 to temporarily ignore a command to the second non-contact switch NCSW2. According to one embodiment, the processing unit PU may transmit a stop command to stop an emitting unit EU of the second non-contact switch NCSW2 from emitting a wireless signal and thereby prevent the second non-contact switch NCSW2 from receiving a reflection signal (i.e., the sensing signal of the sensed target ST) of the wireless signal, thus achieving the technical effect of disabling the second non-contact switch NCSW2 to avoid mis-triggering. Disabling may refer to the action that causes the component to lose the original function in the system (for example, the switch loses a trigger function if it is disabled). The present disclosure, however, does not limit the way of carrying out the embodiments.

Next, the functional structure of the present disclosure is described below.

For example, the processing unit PU may determine whether the first non-contact switch NCSW1 receives the first sensing signal and obtain a first determination result (Yes/no); if the first determination result indicates "Yes", the processing unit PU may further determine whether the second non-contact switch NCSW2 receives the second sensing signal and obtain a second determination result (Yes/no); and if the second determination result indicates "Yes", the processing unit may disable the second non-contact switch, for example, by transmitting a disable command to the second non-contact switch NCSW2 or ignoring a return signal from the second non-contact switch NCSW2. Therefore, when the sensed target ST enters the sensing region of the switch set SWS and a plurality of non-contact switches NCSW sense the sensing signal from the sensed target ST at the same time, only the first non-contact switch NCSW1 may be triggered, and the second non-contact switch NCSW2 may not be triggered even if the sensed target ST enters the sensing region of the second non-contact switch NCSW2. Therefore, according to the present disclosure, the service efficiency of the non-contact switch control system 1 may be improved, the possibility that a large quantity of non-contact switches NCSW are triggered unintentionally within a short time may be significantly reduced, and the situation where the sensed target ST simultaneously triggers a plurality of non-contact switches NCSW can be avoided.

According to this embodiment, the non-contact switch control system 1 of the present disclosure includes the switch set SWS, and the switch set SWS includes the plurality of non-contact switches NCSW. Referring to FIG. 2, according to one embodiment of the present disclosure, the non-contact switch NCSW includes: a sensing module SM and a switch module SWM. The sensing module SM may further include: an emitting unit EU, and a receiving unit RU.

Figure 3:
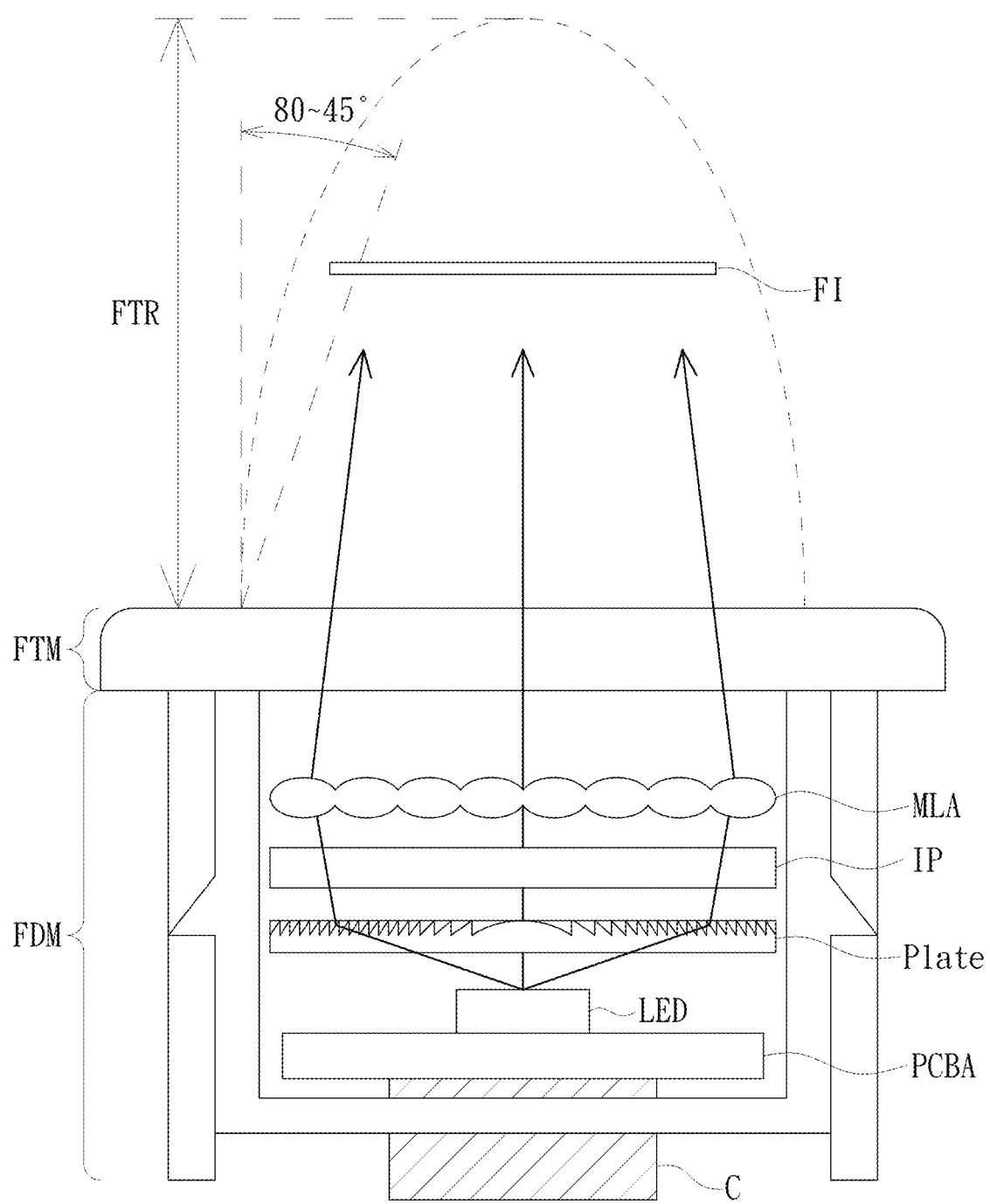
FIG. 3 is a schematic diagram of a floating display touch switch according to an embodiment of the present disclosure.

Next, reference is made to FIG. 3. According to one embodiment, the non-contact switch NCSW is implemented as a floating display touch switch, and FIG. 3 is a schematic diagram of a floating display touch switch according to an embodiment of the present disclosure. The floating display touch switch includes: a floating display module FDM and a floating touch module FTM. The floating display module FDM includes: a microlens array MLA, an imaging plate IP, a plate lens Plate, a circuit board PCBA, a light-emitting diode LED, and a connector C. The floating display touch switch according to this embodiment may receive the sensing signal from the sensed target ST within the sensing region FTR by the floating touch module FTM (which includes the sensing module SM). The sensing region may include the sensed distance and the sensed angle. The sensed distance may be a distance from the sensing surface of the sensing module SM to the sensed target ST, which may be 0-10 cm. The sensed angle may be an angle formed by inward contraction from any point on the outer edge (e.g., 0 cm) of the sensing surface of the sensing module SM to a sensing failure point (i.e., a distance that does not react to the sensed target ST, which may be 10 cm), such as 80 degrees to 45 degrees.

The following is a description of the sensing module SM of the non-contact switch NCSW.

For example, the sensing module SM may be a capacitive sensing module. In the situation where the sensing module SM is a capacitive sensing module, the sensed target ST may be a human body, a part of a human body, or any object that may change the capacitance value sensed by the sensing module SM. The capacitive sensing module may sense the capacitance value of the human body, and the processing unit PU may transmit a control signal to control the switch module SWM based on the change of the capacitance value.

For example, the sensing module SM may be an infrared sensing module, the sensing module SM may include an emitting unit EU and a receiving unit RU, the emitting unit EU may be used for transmitting a wireless signal to the sensed target ST, and the receiving unit RU may be used for receiving a sensing signal. In the situation where the sensing module SM is an infrared sensing module, the sensed target ST may be a human body, a part of a human body, or an object that may reflect the infrared (i.e., a reflection signal of the wireless signal) emitted from the emitting unit EU (which is used for emitting infrared). The receiving unit RU of the sensing module SM may receive the infrared emitted from the emitting unit EU and reflected by an object. According to this embodiment, the sensing signal is the reflection signal of the wireless signal, and the processing unit PU may transmit a control signal to control the switch module SWM based on the sensing signal (i.e., the reflection signal of the wireless signal) of the sensed target received by the receiving unit RU.

For example, the sensing module SM may be an ultrasonic sensing module, and the sensing module SM may include an emitting unit EU and a receiving unit RU. In the situation where the sensing module SM is an ultrasonic sensing module, the sensed target ST may be a human body, a part of a human body, or an object that may reflect an ultrasonic wireless signal (i.e., a reflection signal of the wireless signal) emitted by the emitting unit EU for transmitting an ultrasonic wireless signal. The receiving unit RU of the sensing module SM may receive the ultrasonic wireless signal obtained by reflecting the ultrasonic wireless signal emitted by the emitting unit EU by the object. The processing unit PU may transmit a control signal to control the switch module SWM based on the sensing signal (i.e., the reflection signal of the wireless signal) of the sensed target received by the receiving unit RU.

The above examples are provided only as exemplary embodiments of the non-contact switch NCSW of the present disclosure, and the scope of the present disclosure is not limited to the exemplified embodiments. Any device that may provide a sensing region, receive a sensing signal from a sensed target within the sensing region, and control a switch state of a switch module SWM by a processing unit PU may be used as the non-contact switch NCSW of the present disclosure.

According to this embodiment, the switch module SWM of the non-contact switch NCSW of the present disclosure refers to a device used as a switch in a circuit. The switch module SWM has a first switch state and a second switch state. The first switch state and the second switch state refer to switch states of the switch module SWM in the circuit. The first switch state may include an open-circuit state or a short-circuit state, and the second switch state may include, a short-circuit state or an open-circuit state. That is, the first switch state and the second switch state refer to different switch states in the circuit, respectively. The processing unit PU may transmit a control signal to switch the switch state of the switch module SWM. The switch module SWM may be connected to other external circuits so that the processing unit PU may control the external circuits based on the switch state of the switch module SWM. For example, the switch module SWM may be a multistage diverter switch (e.g., to cause an open/short circuit), or a transistor switch (e.g., to control the voltage/current to cause a transistor to act in a cutoff/saturation region, where the switch state may be regarded as the open-circuit state of the present disclosure when the transistor acts in the cutoff region, and the switch state may be regarded as the short-circuit state of the present disclosure when the transistor acts in the saturation region), or a logic circuit, but the present disclosure is not limited thereto. Any device that may control an external circuit by changing the switch state may be used as the switch module SWM of the present disclosure.

The non-contact switch control system 1 of the present disclosure includes the storage unit SU. The storage unit SU refers to a device connected to the processing unit PU and configured to store the control program. For example, the storage unit SU may be a non-volatile memory, a memory card, a buffer, or other devices with the same function. The enumerated types of storage devices are merely examples, and the present disclosure is not limited thereto. All storage devices with the same function may be used as the storage unit SU of the present disclosure.

Figure 4:
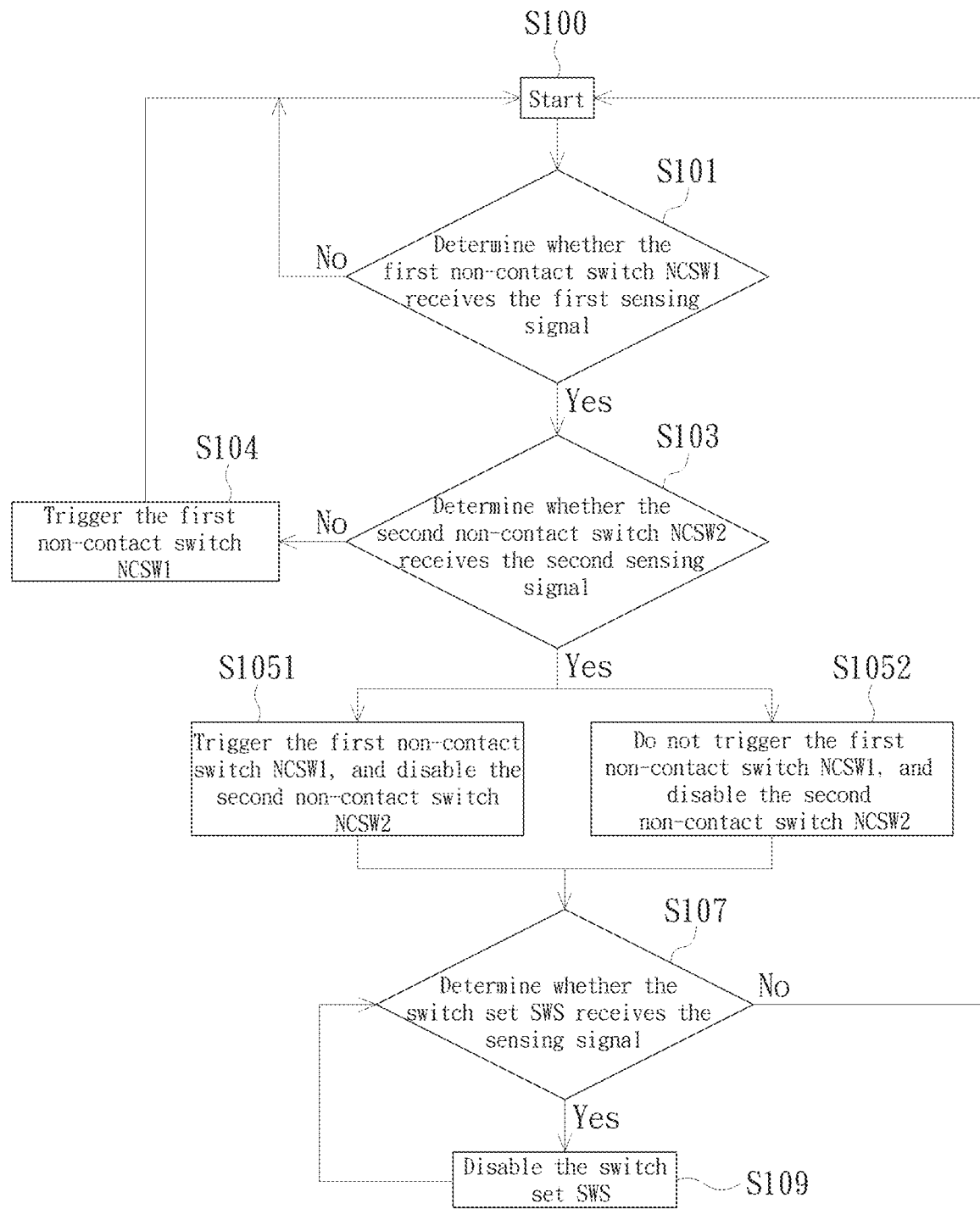
FIG. 4 is a flow diagram according to an embodiment of the present disclosure.

Reference is next made to FIG. 4. FIG. 4 is a flow diagram according to an embodiment of the present disclosure. According to this embodiment, the processing unit PU may execute the control program. The control program includes the following steps:

Step S100: Start the flow, and then the flow goes to Step S101.

Step S101: Determine whether the first non-contact switch NCSW1 receives the first sensing signal, and obtain the first determination result (which may indicate "Yes" or "No"); when the first determination result indicates "No", the flow returns to Step S100 and starts a cycle of repeatedly determining whether the first non-contact switch NCSW1 receives the first sensing signal; and when the first determination result indicates "Yes", the flow goes to Step S103.

Step S103: If the first determination result indicates "Yes", determine whether the second non-contact switch NCSW2 receives the second sensing signal, and obtain the second determination result (Yes/no); when the second determination result indicates "No", the flow goes to Step S104; and when the second determination result indicates "Yes", the flow goes to Step S1051 or Step S1052.

Step S104: When it is determined that only a single non-contact switch NCSW is triggered and thus the second non-contact switch NCSW2 does not need to be disabled, trigger the first non-contact switch NCSW1.

Step S1051: When it is determined that a plurality of non-contact switches NCSW are triggered and thus it is necessary to prevent part of the non-contact switches NCSW from being triggered, trigger the first non-contact switch NCSW1 and disable the second non-contact switch NCSW2. Then, the flow goes to Step S107.

Step S1052: When it is determined that a plurality of non-contact switches NCSW are triggered and thus it is necessary to prevent all the non-contact switches NCSW from being triggered, do not trigger the first non-contact switch NCSW1, and disable the second non-contact switch NCSW2. Then, the flow goes to Step S107.

Step S107: Determine whether the switch set SWS receives the sensing signal and obtain a third determination result (Yes/no); when the third determination result indicates "Yes", the flow goes to Step S109; and when the third determination result indicates "No", the flow goes to Step S100 to return to an initial state of the system.

Step S109: Disable the switch set SWS.

According to the present disclosure, via disabling the switch set SWS, the system may be initialized only after the sensed target ST with the large cross-sectional area is removed, that is, the non-contact switch NCSW may be triggered again after the sensed target ST with the large cross-sectional area is removed.

According to this embodiment, the non-contact switch control system 1 of the present disclosure includes the processing unit PU. The processing unit PU refers to a device that is, as a processing core of the device, connected to the plurality of non-contact switches NCSW and the storage unit SU, and configured to execute the control program stored in the storage unit SU so as to control the switch state of the switch module SWM. For example, the processing unit PU may be a microcontroller unit (MCU), a central processing unit (CPU), or other devices with the same function. The enumerated types of processing units are merely examples, and the present disclosure is not limited thereto. Any device that may transmit a control signal to control the switch state of the switch module SWM may be used as the processing unit PU of the present disclosure.

Figure 5:
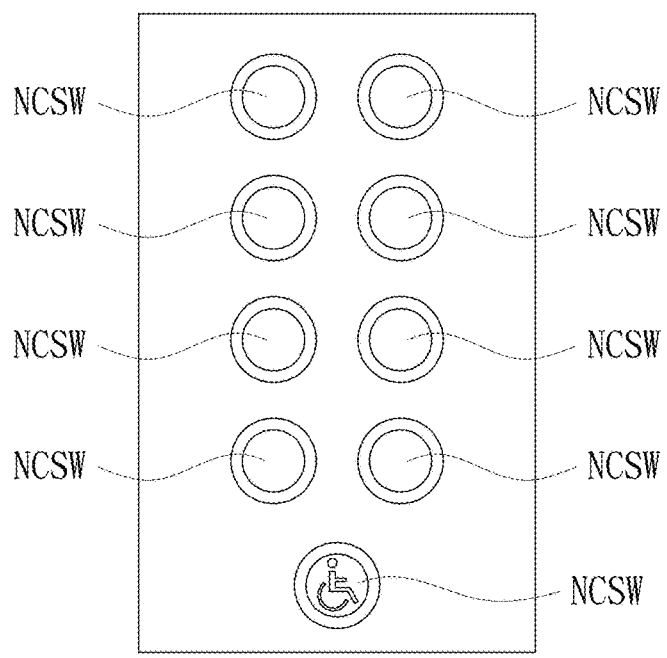
FIG. 5 is a schematic diagram of an embodiment of the present disclosure applied to an elevator system.
Figure 6:
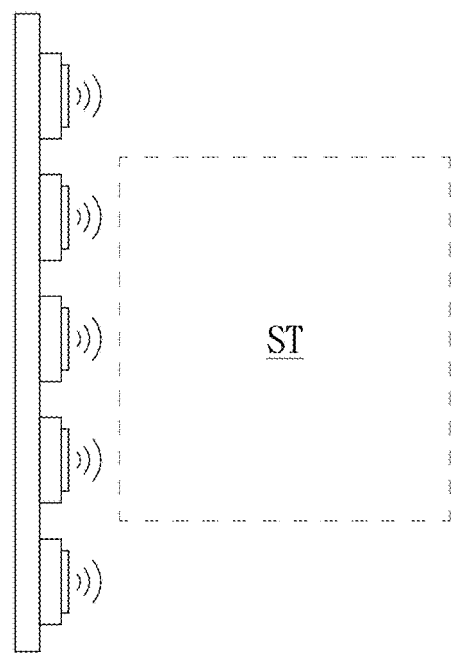
FIG. 6 is a schematic diagram of receiving a sensing signal from a sensed target according to an embodiment of the present disclosure.
Figure 7:
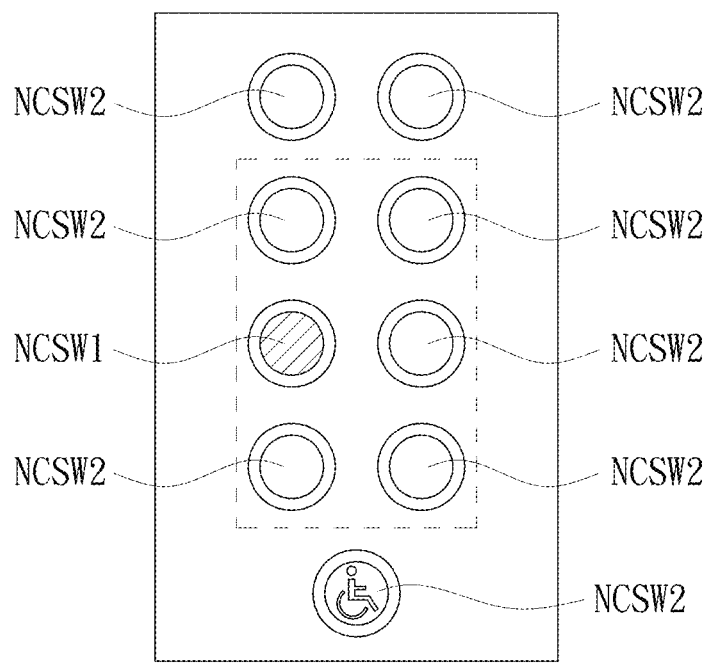
FIG. 7 is a schematic diagram of a sensing range corresponding to a sensed target according to an embodiment of the present disclosure.

Reference is next made to FIG. 5 to FIG. 7. Taking an elevator system as an example, as shown in FIG. 5, a plurality of non-contact switches NCSW are included in an operation panel of an elevator, and as shown in FIG. 6, when the sensed target ST with the large cross-sectional area enters sensing regions of the plurality of non-contact switches NCSW, six non-contact switches NCSW within a dashed box as shown in FIG. 7 may be triggered by the sensed target ST in the absence of the non-contact switch control system 1 of the present disclosure. However, as shown in FIG. 7, compared with the prior art, the non-contact switch control system 1 of the present disclosure may prevent a large quantity of non-contact switches NCSW from being simultaneously triggered by the sensed target ST. On the premise that the elevator system may be normally used, a user who uses the elevator system in a normal manner (meaning a user currently only triggers the first non-contact switch NCSW1 corresponding to a floor) will not be influenced, the quantity of non-contact switches NCSW that would have been triggered is reduced to one, only the first non-contact switch NCSW1 can be triggered by the sensed target ST, and the remaining second non-contact switches NCSW2 within the dashed box will not be triggered by the sensed target ST.

Figure 8:
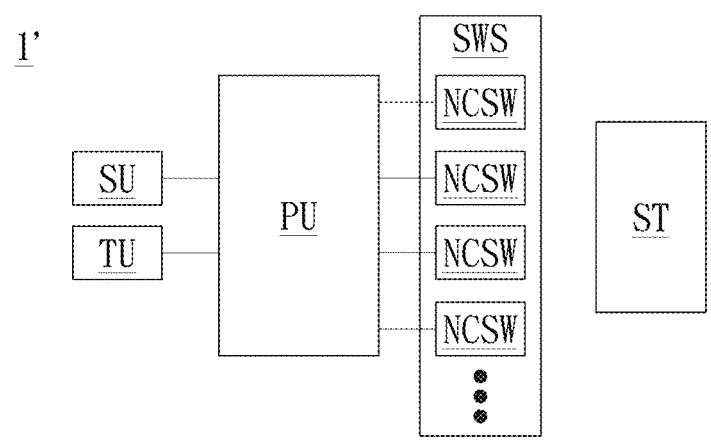
FIG. 8 is a block diagram of a non-contact switch control system according to another embodiment of the present disclosure.

Reference is next made to FIG. 8. FIG. 8 is a block diagram of a non-contact switch control system 1' according to an embodiment of the present disclosure.

The present disclosure provides various implementations. According to the various embodiments of the present disclosure, components/devices with the same reference numeral represent that the functions of the components/devices may also include the same functions as other embodiments, which are thus not repeated in the various embodiments of the present disclosure, and only the differences from other embodiments will be described. The items mentioned in the various embodiments may be rearranged and combined without any conflict, and are applied to the various embodiments. The present disclosure is not limited to the exemplified embodiments.

According to this embodiment, the non-contact switch control system 1' of the present disclosure includes: a switch set SWS, a processing unit PU, a storage unit SU, and a timing unit TU. The switch set SWS includes a plurality of non-contact switches NCSW. The processing unit PU is connected to the plurality of non-contact switches NCSW, the storage unit SU, and the timing unit TU.

Figure 9:
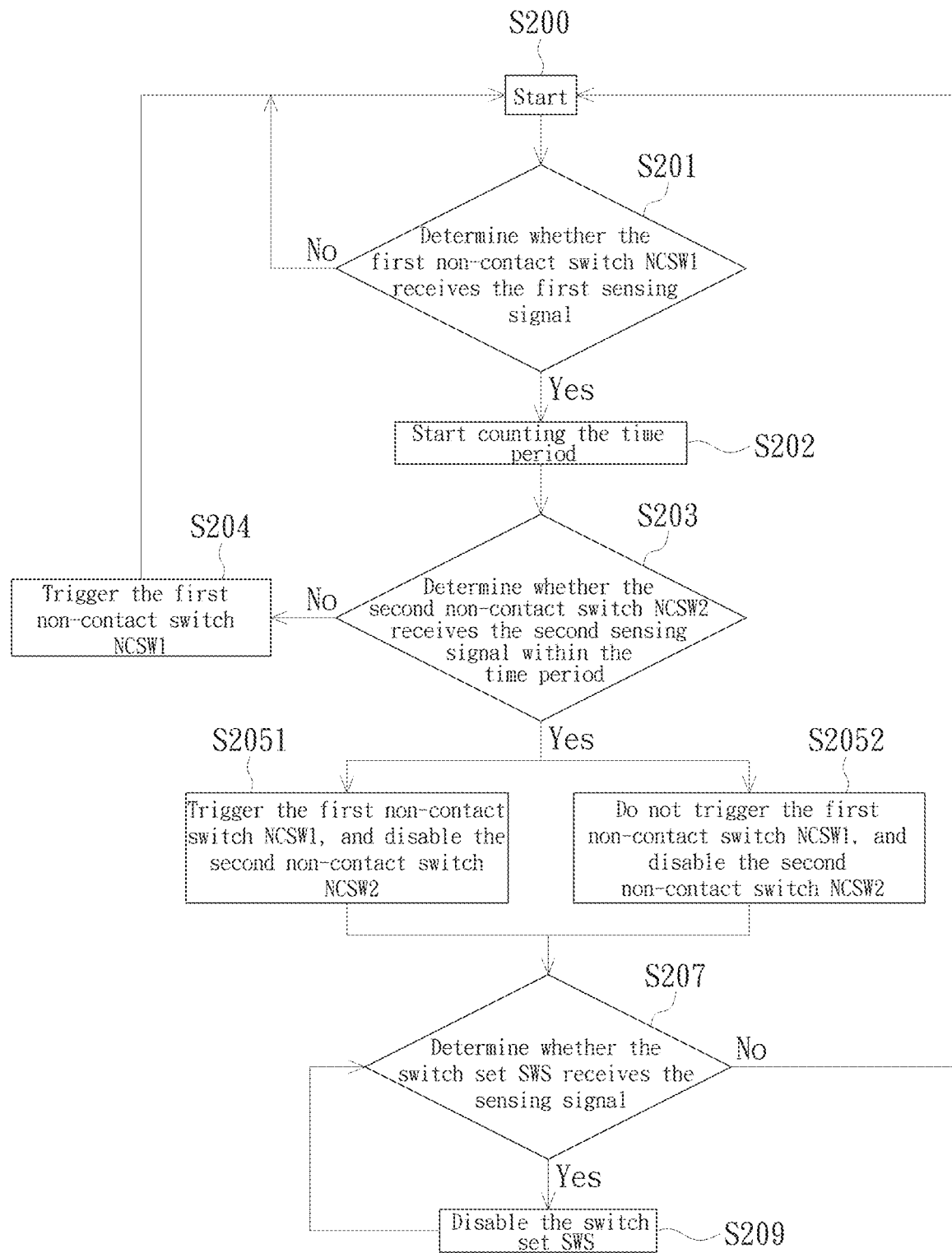
FIG. 9 is a flow diagram according to another embodiment of the present disclosure.

Reference is next made to FIG. 9. FIG. 9 is a flow diagram according to another embodiment of the present disclosure. According to this embodiment, the non-contact switch control system 1' of the present disclosure further includes the timing unit TU. The control program includes:

Step S200: Start the flow, and the flow goes to Step S201.

Step S201: Determine whether the first non-contact switch NCSW1 receives the first sensing signal, and obtain the first determination result (Yes/no); when the first determination result indicates "No", return to Step S200 and start a cycle of repeatedly determining whether the first non-contact switch NCSW1 receives the first sensing signal; and when the first determination result indicates "Yes", the flow goes to Step S202.

Step S202: Start counting the time period using the timing unit TU.

Step S203: Determine whether the second non-contact switch NCSW2 receives the second sensing signal within the time period, and obtain the second determination result (Yes/no); when the second determination result indicates "No", the flow goes to Step S204; and when the second determination result indicates "Yes", the flow goes to Step S2051 or Step S2052.

Step S204: When it is determined that only a single non-contact switch NCSW is triggered within the time period and thus the second non-contact switch NCSW2 does not need to be disabled, trigger the first non-contact switch NCSW1.

Step S2051: When it is determined that a plurality of non-contact switches NCSW are triggered and it is necessary to prevent some non-contact switches NCSW from being triggered, trigger the first non-contact switch NCSW1, and disable the second non-contact switch NCSW2. Then, the flow goes to Step S207.

Step S2052: When it is determined that a plurality of non-contact switches NCSW are triggered and it is necessary to prevent all the non-contact switches NCSW from being triggered, do not trigger the first non-contact switch NCSW1, and disable the second non-contact switch NCSW2. Then, the flow goes to Step S207.

Step S207: Determine whether the switch set SWS receives the sensing signal and obtain the third determination result (Yes/no); when the third determination result indicates "Yes", the flow goes to Step S209; and when the third determination result indicates "No", the flow goes to Step S200 to return to an initial state of the system.

Step S209: Disable the switch set SWS.

According to this embodiment, the non-contact switch control system 1' of the present disclosure may further provide the time period by the timing unit TU. For example, in the elevator system, when a passenger in the elevator makes excessive hand movements, the hand of the passenger may enter the sensing regions of a plurality of non-contact switches NCSW and may thus trigger a plurality of non-contact switches NCSW. The timing unit TU of this embodiment may provide a time period, which is preferably 0.1 second according to one embodiment. By setting the time period, a passenger may be prevented from triggering a plurality of non-contact switches NCSW unintentionally due to excessive hand movements. The timing unit TU may be a timing device that is repeatedly opened and closed through components such as a motor and a coil, and the timing unit TU counts the number of times of open/short circuits of contacts to calculate the time unit to prevent the non-contact switch NCSW from being triggered unintentionally. However, the type of the timing unit TU and the length of the time period are not limited by the present disclosure, and any timing device that may calculate the time to prevent the non-contact switch NCSW from being triggered unintentionally may be used as the timing unit TU of the present disclosure.

Figure 10:
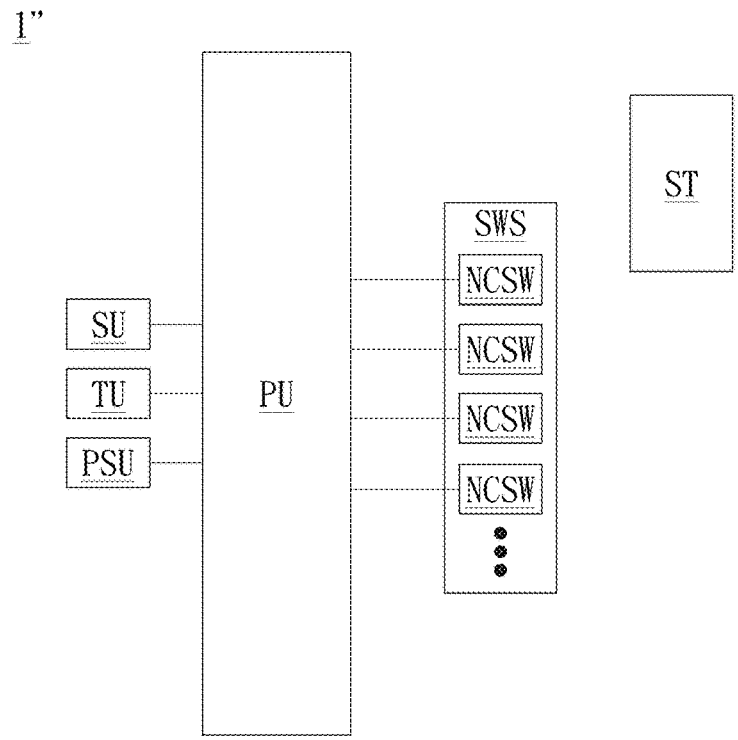
FIG. 10 is a block diagram of a non-contact switch control system according to yet another embodiment of the present disclosure.

Reference is next made to FIG. 10. FIG. 10 is a block diagram of a non-contact switch control system 1" according to an embodiment of the present disclosure.

According to this embodiment, the non-contact switch control system 1" of the present disclosure includes: a switch set SWS, a processing unit PU, a storage unit SU, a timing unit TU, and a prompt unit PSU. The switch set SWS includes a plurality of non-contact switches NCSW. The processing unit PU is connected to the plurality of non-contact switches NCSW, the storage unit SU, the timing unit TU, and the prompt unit PSU.

According to this embodiment, the non-contact switch control system 1" of the present disclosure further includes: the prompt unit PSU configured to provide an operation prompt. For example, when the sensing signal of the sensed target ST is sensed within sensing regions of a plurality of non-contact switches NCSW at the same time point, the processing unit PU may disable the second non-contact switch NCSW2 to prevent the second non-contact switch from being triggered. The operation prompt refers to a prompt to prompt a user that, for example, the second non-contact switch NCSW2 is in a disabled state. According to this embodiment, the prompt unit PSU may be a separate device and is connected to the processing unit PU separately. The prompt unit PSU may be a buzzer, a light-emitting diode, a liquid crystal display, etc. The prompt unit PSU may transmit prompt information (such as sound information, text information, and color information), and prompt, by making a sound, turning on light-emitting diodes of different colors, displaying text, etc., a user that the sensing signal of the sensed target ST is sensed within the sensing regions of a plurality of non-contact switches NCSW (i.e., the non-contact switch control system 1 senses a sensed target ST with a large cross-sectional area, or the user makes excessive movements) while the processing unit PU is executing a control program of stopping transmitting a second control signal to the second non-contact switch.

Figure 11:
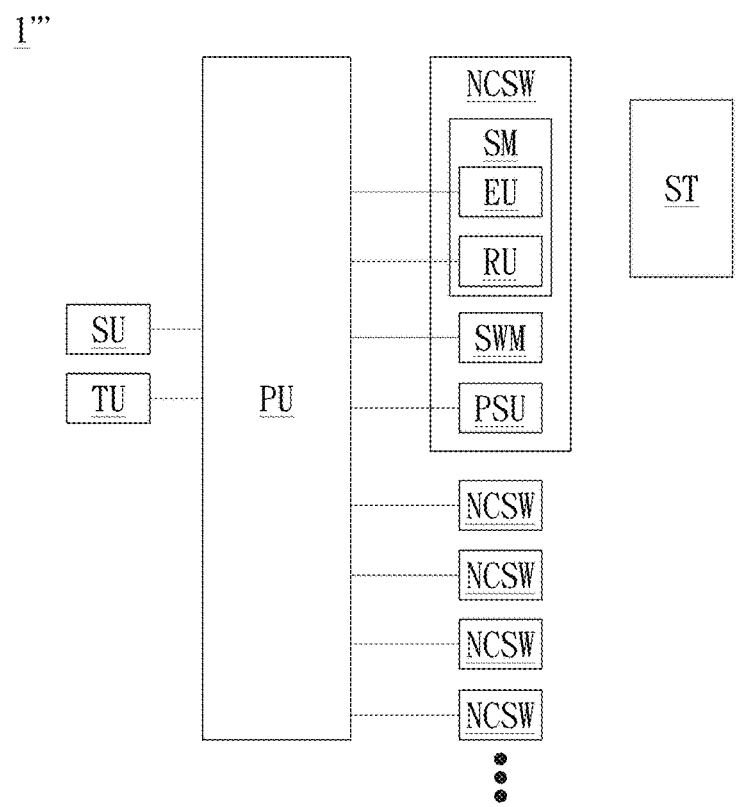
FIG. 11 is a block diagram of a non-contact switch control system according to yet another embodiment of the present disclosure.

Reference is next made to FIG. 11. FIG. 11 is a block diagram of a non-contact switch control system 1''' according to an embodiment of the present disclosure. The present disclosure herein provides another implementation with respect to the aforementioned embodiments. According to this embodiment, the prompt unit PSU may also be included in the non-contact switch NCSW.

To sum up, when the sensing signal of the sensed target is received within sensing regions of a plurality of non-contact switches, the non-contact switch control system may take the non-contact switch that first receives the sensing signal as the first non-contact switch, take the non-contact switch other than the first non-contact switch as the second non-contact switch, determine whether the first non-contact switch receives the first sensing signal, then determine whether the second non-contact switch receives the second sensing signal, and if determination results are both Yes, determine that a plurality of non-contact switches in the switch set are triggered unintentionally by an object with a large cross-sectional area within a short time, and disable the second non-contact switch. By means of the above-mentioned functional structure of the present disclosure, even if the plurality of non-contact switches are triggered unintentionally by the object with the large cross-sectional area within a short time, only the non-contact switch that first receives the sensing signal from the sensed target, namely the first non-contact switch, may be triggered. According to the present disclosure, the service efficiency of the non-contact switch control system may be improved, and the possibility that a large quantity of non-contact switches are triggered unintentionally within a short time may be avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-contact switch control system, comprising:
a switch set configured to receive a sensing signal from a sensed target, wherein the switch set comprises a first non-contact switch and a second non-contact switch, the sensing signal comprises a first sensing signal and a second sensing signal;
a storage unit configured to store a control program; and
a processing unit connected to the switch set and the storage unit, and configured to execute the control program and control the switch set based on the sensing signal,
wherein the control program comprises:
determining whether the first sensing signal is received by the first non-contact switch;
determining whether the second sensing signal is received by the second non-contact switch after the first sensing signal is received by the first non-contact switch; and
ignoring the second sensing signal when the second sensing signal is received by the second non-contact switch after the first sensing signal is received by the first non-contact switch;
wherein each non-contact switch is a floating display touch switch, wherein the floating display touch switch includes a floating touch module, the floating touch module includes a sensing module to receive a sensing signal within a sensing region, the sensing region includes a sensed distance and a sensed angle, and the sensed angle is formed by inward contraction from any point on the outer edge of a sensing surface of the sensing module to a sensing failure point.

2. The non-contact switch control system according to claim 1, wherein the control program further comprises:
after the second sensing signal is ignored, determining whether the sensing signal is received by the switch set; and
ignoring the sensing signal.

3. The non-contact switch control system according to claim 1, wherein the control program further comprises:
triggering the first non-contact switch when the second sensing signal is received by the second non-contact switch.

4. The non-contact switch control system according to claim 1, wherein the control program further comprises:
the first non-contact switch is not triggered when the second sensing signal is received by the second non-contact switch.

5. The non-contact switch control system according to claim 1, further comprising:
a timing unit connected to the processing unit, and configured to count a time period,
wherein the control program further comprises:
starting to count the time period, and determining whether the second sensing signal is received by the second non-contact switch within the time period after the first sensing signal is received by the first non-contact switch.

6. The non-contact switch control system according to claim 1, further comprising:
a prompt unit connected to the processing unit, and configured to provide an operation prompt.

7. The non-contact switch control system according to claim 1, wherein the switch set comprises: an emitting unit configured to transmit a wireless signal to the sensed target, wherein the sensing signal is a reflection signal of the wireless signal.

8. A non-contact switch control system, comprising:
a switch set configured to receive a sensing signal from a sensed target, wherein the switch set comprises a first non-contact switch and a second non-contact switch, the sensing signal comprises a first sensing signal and a second sensing signal;
a storage unit configured to store a control program; and a processing unit connected to the switch set and the storage unit, and configured to execute the control program and control the switch set based on the sensing signal, wherein the control program comprises:
- determining whether the first sensing signal is received by the first non-contact switch;
- determining whether the second sensing signal is received by the second non-contact switch after the first sensing signal is received by the first non-contact switch; and
- ignoring the second sensing signal when the second sensing signal is received by the second non-contact switch after the first sensing signal is received by the first non-contact switch;

wherein each non-contact switch is a floating display touch switch, wherein the floating display touch switch includes a floating display module and a floating touch module, the floating touch module includes a sensing module to receive a sensing signal within a sensing region, the sensing region includes a sensed distance and a sensed angle, and the sensed angle is formed by inward contraction from any point on the outer edge of a sensing surface of the sensing module to a sensing failure point.

* * * * *